United States Patent [19]

Robe et al.

[11] 4,365,288
[45] Dec. 21, 1982

[54] ELECTRIC POWER CONVERTER FOR RECREATIONAL VEHICLE

[75] Inventors: John K. Robe, Newport Beach; Robert M. Keranen, Tustin, both of Calif.

[73] Assignee: Carr-Griff, Fullerton, Calif.; a part interest

[21] Appl. No.: 16,928

[22] Filed: Mar. 2, 1979

[51] Int. Cl.³ .............................................. H05K 7/20
[52] U.S. Cl. .................................. 363/141; 361/383; 361/384; 363/15
[58] Field of Search ...................... 165/129; 174/16 R; 363/15, 16, 34, 141; 361/381, 382, 383, 384, 386–389; 336/92

[56] References Cited

U.S. PATENT DOCUMENTS 3,407,869 10/1968 Staunton ........................... 174/16 R
3,462,553 8/1969 Spranger ............................. 361/383
3,857,044 12/1974 Papoi .................................. 361/383
3,863,140 1/1975 Easter .................................. 363/15

OTHER PUBLICATIONS

"The 7200 Series Electrical Systems Control Center", Progressive Dynamics, Inc., 1977, Part No. 710239.

*Primary Examiner*—G. P. Tolin
*Attorney, Agent, or Firm*—Gordon L. Peterson

[57] ABSTRACT

A converter adapted to be mounted within an opening in a wall of a recreational vehicle comprising a receptacle adapted to be received within the opening and an openable cover plate attached to the receptacle to provide access to the interior of the receptacle. A base mounting plate is mounted in the receptacle and a plurality of circuit elements, including a step-down transformer, is mounted on the base mounting plate. Ventilation air is provided through vent openings in the cover plate. By utilizing high frequency alternating current, transformer size is reduced and transformer hum is eliminated.

12 Claims, 8 Drawing Figures

ELECTRIC POWER CONVERTER FOR RECREATIONAL VEHICLE

BACKGROUND OF THE INVENTION

Many recreational vehicles, such as motor homes and travel trailers, utilize both 110-volt ac and 12-volt dc. For example, the 110-volt ac may be used for air conditioning units and for operating various appliances while the interior lights of the recreational vehicle may be operated on 12-volt dc. When electrical hook-ups are used, it is necessary to convert the 110-volt ac from the electrical hook-up to 12-volt dc to operate the lights and the other direct current electrical devices within the recreational vehicle while also supplying the 110-volt ac to those circuits of the recreational vehicle which require it. These functions are performed by a converter.

Converters of this type typically include a step-down transformer which reduces the 110-volt ac to a lower voltage level, such as 12 volts and a rectifier for converting the ac to dc. Although these are relatively simple functions, their adaptation to recreational vehicles introduces a number of significant problems. For example, space is at a premium in recreational vehicles and so the dimensions of equipment, such as converters, must be held to a minimum. Similarly, it is desired to minimize the weight of accessory equipment carried by the recreational vehicle. Unfortunately, prior art converters are larger and heavier than desired.

Transformer hum is also very undesirable in recreational vehicles because of the proximity of the occupants to the transformer and because the sleeping accommodations of the recreational vehicle are typically not far from the transformer. It is also important that the circuit elements of the converter be readily accessible from the interior of the recreational vehicle so that the converter can be easily repaired and maintained. All of these objectives must be accomplished without increasing the cost of the converter beyond what is considered acceptable in the recreational vehicle market.

SUMMARY OF THE INVENTION

The present invention provides a small, compact lightweight converter which is adapted to be mounted in an opening in a wall of a structure, such as a recreational vehicle. Although the converter is particularly adapted for use with recreational vehicles, such as motor homes and travel trailers, its use is not limited to this field. The converter of this invention eliminates transformer hum, and the components of the converter are readily accessible from the interior of the vehicle.

The dimensions of the converter are reduced by the physical arrangement of the components of the converter and by utilizing a high frequency transformer having as its input high frequency alternating current. The transformer is characteristically the largest component of the converter, and by utilizing a high frequency ac input to the transformer, the weight and dimensions of the transformer can be substantially reduced. In addition, by utilizing a frequency above the audio range, transformer hum is eliminated.

In a preferred construction, the 110-volt ac received by the converter is rectified to provide fluctuating direct current which is then filtered. The filtered dc is then converted to high frequency ac and fed to the transformer which reduces the voltage level. Finally, the stepped-down, high-frequency ac is converted to dc by a suitable rectifier.

The converter also includes a receptacle adapted to be received within an opening in a wall of the vehicle. Because of the compact nature of the converter, the receptacle may have a depth which is only of the order of two inches. The receptacle also has a rear wall. The converter includes a cover plate attached to the receptacle to permit the cover plate to be opened to provide access to the interior of the receptacle. The cover plate can be opened by completely removing it or by mounting it in door or window-like fashion on the receptacle. The cover plate is exposed in the interior of the vehicle so that, by opening the cover plate, access can be obtained to the interior of the receptacle from the interior of the vehicle.

Ventilation air from the interior of the vehicle is supplied through a vent opening in the cover plate to cool the circuit elements of the converter. Because ventilation air is provided from the interior of the vehicle, in the unlikely event of a fire occurring within the receptacle, it would be quickly made manifest to the occupants.

A number of the circuit elements of the converter are mounted on a base mounting plate which is in turn releasably mounted within the converter. This enables the base mounting plate and the associated circuit elements to be easily replaced with another unit or module in the event of a malfunction.

The transformer and the filter are preferably mounted on the base mounting plate and are positioned between the base mounting plate and the rear wall of the receptacle. Because the transformer is small, only a relatively small space is required between the base mounting plate and the rear wall.

The converter also preferably includes a first mounting plate which is releasably mounted on the receptacle. The first mounting plate may be mounted directly on the receptacle or be mounted on the base mounting plate, and therefore, mounted on the receptacle via the base mounting plate. In any event, at least a portion of the first mounting plate is spaced from the base mounting plate and lies on the side thereof remote from the rear wall of the receptacle. This provides an air passage between the mounting plates so that air from the vent opening can pass between the mounting plates for cooling purposes. At least one heat-producing circuit element is mounted on the first mounting plate and is cooled by the air passing between the mounting plates.

To facilitate access to the circuit element most likely to require attention, such circuit element is mounted on the base mounting plate, and a section of the first mounting plate is removed to provide access to such circuit element. For example, in one embodiment of the converter, a certain transistor has been found most likely to require checking, and this transistor is mounted on the base mounting plate in a position to be accessible through the removed portion of the first mounting plate. Thus, access to this transistor from the interior of the vehicle is immediately provided upon opening of the cover plate.

In a preferred embodiment, the cover plate projects into the interior of the vehicle. The cover plate includes an end wall and a peripheral wall with at least a portion of the vent opening being in the peripheral wall. The peripheral wall preferably includes at least one section which slopes inwardly as it extends toward the end wall, and at least a portion of the vent opening is in the sloping section of the peripheral wall. By sloping the peripheral wall, it is more difficult for the occupants of the vehicle to block off the vent opening. For example, this is particularly true when the vent opening is provided in the upper section of the peripheral wall, and the upper section of the peripheral wall is sloped to prevent articles which are placed on the peripheral wall from remaining there. To enhance air flow, portions of the vent opening are preferably in the upper and lower sections of the peripheral wall.

To restrict access to the interior of the receptacle through the vent opening, an opening is provided in the peripheral wall and a grid having a plurality of apertures therein extends across the opening. The grid comprises a plurality of grid elements, at least some of which have non-circular cross-sectional configurations. The grid elements are oriented to provide the maximum cross-sectional area for the apertures in the vertical direction when the converter is received in the opening in the wall of the vehicle.

The converter also provides ac and dc circuit breakers within separate enclosures within the receptacle. Preferably, a separate wiring chamber or enclosure is provided between the two circuit breaker enclosures, and all of the enclosures can advantageously be located along one side of the base mounting plate. This arrangement makes it much less likely that the field wiring will be disturbed by maintenance or repair work on other portions of the converter.

The invention can best be understood by reference to the following description taken in connection with the illustrative drawings.

DESCRIPTION OF THE PREFERRED EMBODIMENT

Figure 1:
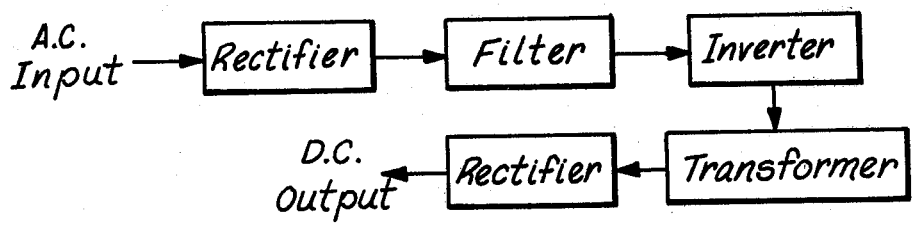
FIG. 1 is a schematic block diagram of some of the components of a converter constructed in accordance with the teachings of this invention.
Figure 2:
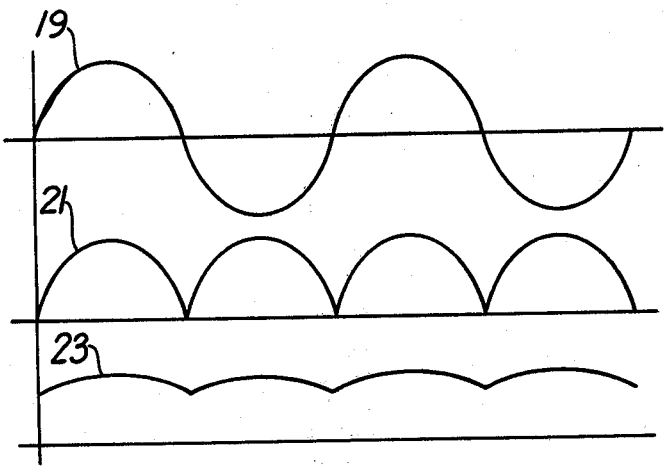
FIGS. 2 and 3 illustrate voltage waveforms at various locations throughout the converter.

FIG. 1 shows a converter 11 which includes a full wave rectifier 13 which receives the standard 110-volt ac input and provides fluctuating direct current to a filter 15 which in turn provides filtered direct current to an inverter 17. Both the rectifier 13 and the filter 15 may be conventional. FIG. 2 shows voltage waveforms 19, 21 and 23 representing, respectively, the ac input to the rectifier 13, the rectified output of the rectifier 13 and the filtered dc output of the filter 15.

Figure 3:
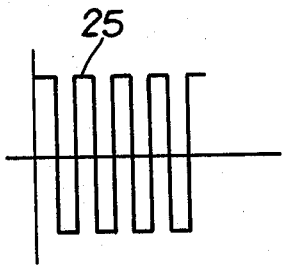

The inverter 17 is of the well-known type which converts the filtered direct current from the filter 15 to a high-frequency square wave alternating current as shown by the waveform 25 in FIG. 3. The frequency of the output of the inverter 17 is preferably above the audio range and, in the embodiment illustrated, is 25,000 Hz. The inverter 17 includes a suitable switching network of transistors which causes the inverting function to be carried out periodically so that every other segment is inverted. By inverting only every other segment of the input to the inverter, the high-frequency square wave pattern shown in FIG. 3 is generated.

A conventional transformer 27 steps down the voltage of the high-frequency ac from the inverter 17 to a level which is less than the voltage level of the ac input to the rectifier 13. For example, the voltage may be stepped down to twelve volts. A rectifier 29 provides full wave rectification of the transformer output and provides a dc output which may be, for example, twelve volts. If desired, the rectifier 29 may have multiple dc outputs, each having a different voltage level.

The electronic portion of the converter 11 may vary, and the arrangement shown in FIGS. 1 to 3 is purely illustrative. However, by utilizing high-frequency ac as the input to the transformer 27, transformer hum is eliminated and the size of the transformer can be substantially reduced. To accomplish this, the frequency should be above 15,000 Hertz.

FIGS. 4-8 show a preferred mechanical arrangement of the components of the converter 11. Although the mechanical arrangement illustrated can be utilized with converters having many different electronic components, it is particularly advantageous to utilize the high-frequency transformer 27 in the interest of reducing the cost and weight of the converter and to eliminate transformer hum.

Figure 4:
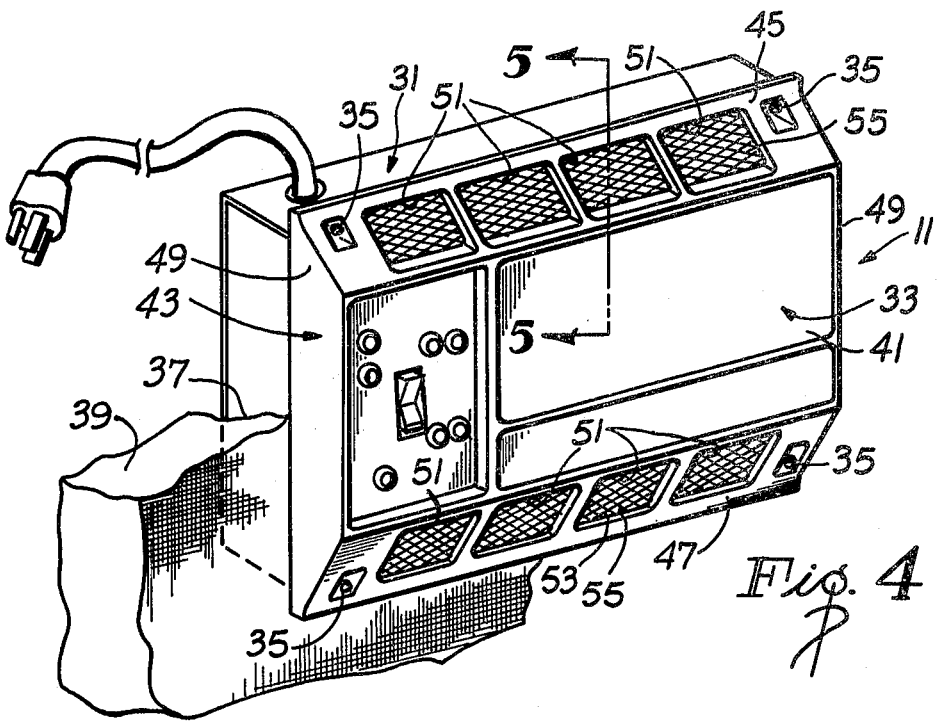
FIG. 4 is a perspective view of one embodiment of converter mounted in a wall of a vehicle with portions of the wall being broken away.

With reference to FIG. 4, the converter 11 includes a receptacle 31 and a cover plate 33 removably attached to the receptacle in any suitable manner, such as by a plurality of screws 35. It is important that the cover plate 33 be openable to provide access to the interior of the receptacle 31. The cover plate 33 can be made openable by being completely removable from the receptacle 31 or by other connections which permit opening of the cover plate by sliding or pivoting it relative to the receptacle.

The converter 11 is adapted to be mounted within an opening 37 in a wall 39 of a structure, such as a vehicle. More specifically, the receptacle 31 is received in the opening 37, and the cover plate 33 is too large to pass through the opening and completely conceals the receptacle and the opening. The cover plate 33 lies entirely within the vehicle and on the inside of the wall 39.

The cover plate 33 includes an end wall 41 and a peripheral wall 43 which comprises an upper section 45, a lower section 47, and opposite identical side sections 49. Each of the sections 45, 47 and 49 is generally planar, and the sections 45 and 47 slope inwardly as they extend away from the receptacle 31.

Figure 5:
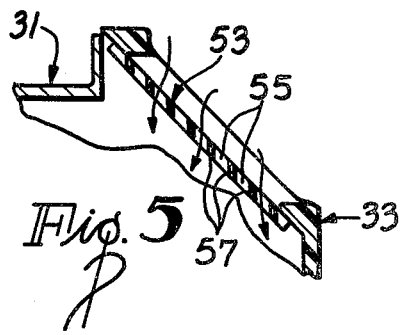
FIG. 5 is an enlarged, fragmentary sectional view of a portion of the receptacle and cover plate.

Vent opening means is provided in the cover plate 33 to permit ventilation air from the interior of the vehicle to pass through the receptacle 31. In the embodiment illustrated, the vent opening means includes a plurality of rectangular openings 51 in the upper section 45 and the lower section 47 and a grid 53 covering each of the openings. Each of the grids 53 defines a plurality of relatively small apertures 55 as best shown in FIG. 5. Each of the grids 53 comprises a plurality of grid elements 57 having generally rectangular cross-sectional configurations. The grid elements 57 are oriented to provide maximum cross-sectional area for the apertures 55 in the vertical direction when the converter 11 is mounted in the opening 37 as shown in FIG. 4. In the embodiment illustrated, the long dimension of each of the grid elements 57 extends vertically when the converter 11 is mounted as shown in FIG. 4. With this arrangement, ventilation air can pass upwardly through the converter 11 via the apertures 55 in the lower section 47, the interior of the converter and the apertures 55 in the upper section 45.

Because the cover plate 33 is exposed within the interior of the vehicle, it is preferably a decorative piece. The receptacle 31 is hidden from view and may take the form of a metal box having an open forward end.

The receptacle 31 includes a rear wall 59 (FIG. 7), a peripheral wall 61 which is rectangular in the embodiment illustrated and a peripheral flange 63 integral with the peripheral wall 61 and extending completely around the receptacle. The peripheral flange 63 has a series of holes to permit the receptacle 31 to be attached to the wall 39 by screws or other suitable fasteners.

Figure 6:
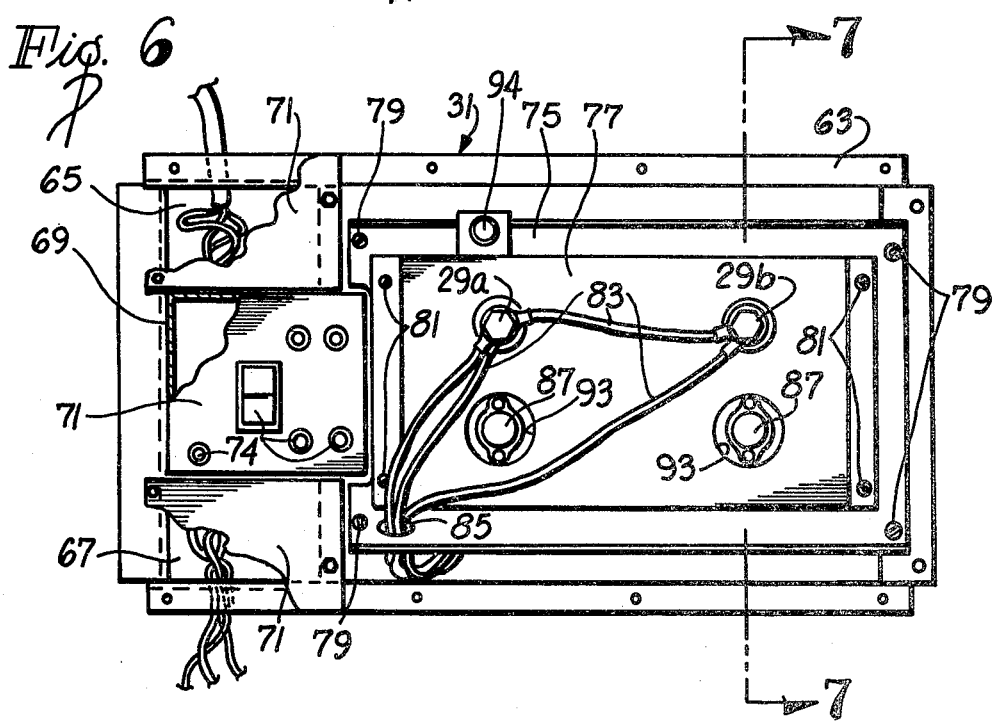
FIG. 6 is a front elevational view of the converter with the cover plate removed.

An ac circuit breaker enclosure 65, a dc circuit breaker enclosure 67, and a wiring enclosure 69 are fixedly mounted in the receptacle 31 along the left side of the receptacle 31 as viewed in FIG. 6. Each of the enclosures 65, 67 and 69 may be in the form of a separate metal box or these enclosures may be formed by separate partitions and walls to completely isolate these enclosures from one another. Each of the enclosures 65, 67 and 69 includes a cover 71 which is attached by screws and which can be removed to provide access to each of the enclosures. A number of controls which may be in the form of buttons or switches 74 are mounted on the cover 71 of the wiring enclosure 69 and project through openings in the cover plate 33 so that they are accessible from the interior of the vehicle.

Figure 7:
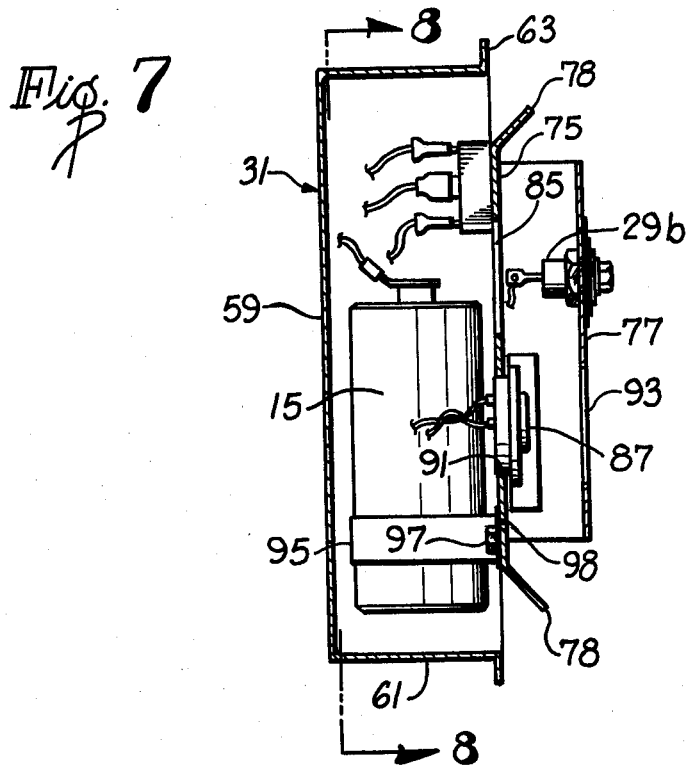
FIG. 7 is a sectional view taken generally along line 7—7 of FIG. 6.
Figure 8:
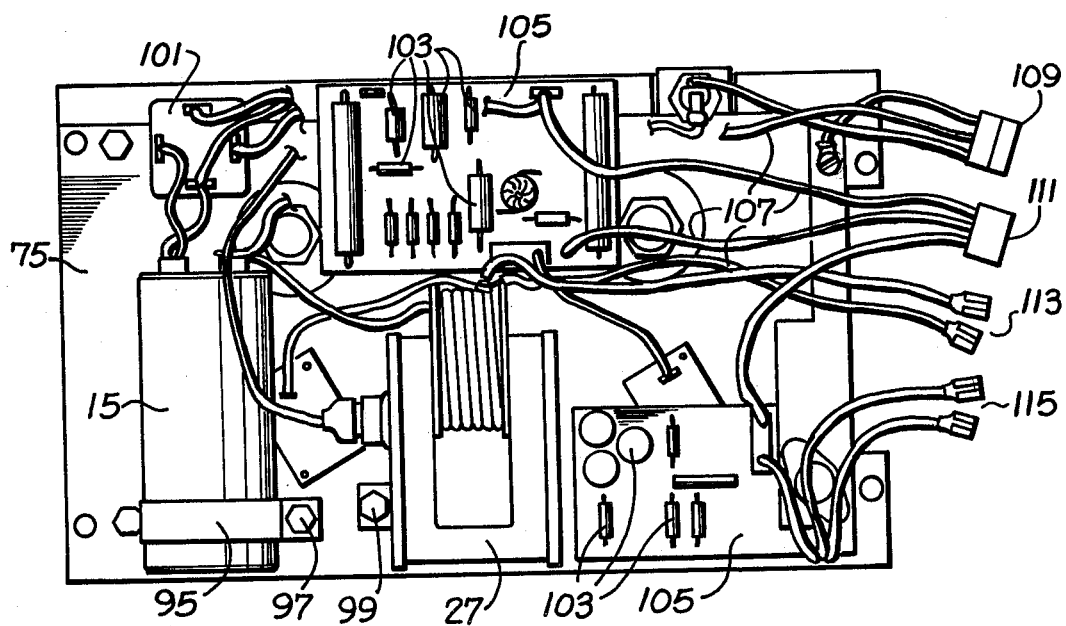
FIG. 8 is a sectional view taken generally along line 8—8 of FIG. 7 showing only the base mounting plate and the circuit elements mounted thereon.

A base mounting plate 75 and an outer mounting plate 77 are provided within the receptacle. The base mounting plate 75 is in the form of a plate having turned up opposite edge portions 78 (FIG. 7). The mounting plates 75 and 77 can be constructed of any suitable rigid material; however, a rigid material, such as metal, is preferred. Both of the mounting plates 75 and 77 should be removably mounted within the converter. Although this can be accomplished in different ways, in the embodiment illustrated, the base mounting plate 75 is removably attached to the receptacle by screws 79 (FIG. 6) which attach the margins of the base mounting plate 75 to the flange 63 and to the enclosures 65 and 67. Although the outer mounting plate 77 could be attached directly to the receptacle 31 is desired, in the embodiment illustrated, it is attached to the base mounting plate by screws 81. Accordingly, both of the mounting plates 75 and 77 can be removed from the receptacle 31 as a unit. The outer mounting plate is channel-shaped and as shown in FIGS. 6 and 7, this spaces apart major portions of the mounting plates 75 and 77 to provide a path for ventilation air.

At least one heat producing electrical component of the converter 11 is mounted on the outer mounting plate 77. In the embodiment illustrated, the rectifier 29 which includes two separate rectifier elements 29a and 29b is attached to the outer mounting plate 77, and conductors 83 from each of them pass through an appropriate opening 85 (FIG. 6) in the base mounting plate 75 into the interior of the receptacle 31.

All of the other circuit elements of the converter 11 are preferably mounted on the base mounting plate 75. Circuit elements of the converter 11 which are most likely to require checking or some other form of attention during use are mounted on the base mounting plate 75 so that they are readily accessible from the outer face, i.e., the face remote from the rear wall 59. In the embodiment illustrated, transistors 87 which form a portion of the inverter 17 are mounted in openings 91 (FIG. 7) of the base mounting plate 75. Sections of the outer mounting plate 77 are removed to form openings 93 so that access can be had directly to the transistors 87 upon removal of the cover plate 33. Also, a fuse 94 is mounted on the base mounting plate 75 near the periphery thereof and the outer mounting plate 77 is of lesser area in plan than the base mounting plate and is located so that the fuse is readily accessible once the cover plate 33 is removed.

The filter 15 and the transformer 27 are suitably mounted on the rear face of the base mounting plate 75 so that both of these circuit elements lie between the base mounting plate and the rear wall 59. The filter 15 and the transformer 27 are the largest of the circuit elements. The filter 15 is mounted on the base mounting plate 75 by a bracket 95 which is attached by screws 97 to the base mounting plate and a layer of heat insulating material 98 separates the filter 15 from the base mounting plate 75. Similarly, the transformer 27 can be releasably attached to the base mounting plate 75 by one or more screws 99. Because the transformer 27 is a high frequency transformer, the space between the base mounting plate 75 and the rear wall 59 can be held to a minimum and may be of the order of two inches.

Other circuit elements, such as circuit element 101, are suitably mounted directly on the base mounting plate 75, and other circuit elements 103 are mounted on boards 105 which are in turn suitably mounted on the base mounting plate. The circuit elements are appropriately electrically interconnected and conductors 107 are connected to the circuitry within the enclosures 65, 67 and 69 by plugs 109, 111, 113 and 115.

To inspect or repair the converter 11, the cover plate 33 is removed. The fuse 94 and the transistors 87 can then be checked. If work on, or inspection of, any of the other circuit components is desired, the mounting plates 75 and 77 and all of the circuit components attached thereto can be removed by removing the screws 79. A new mounting plate module can then be mounted in the receptacle 31 while the original module is being inspected or repaired.

Although an exemplary embodiment of the invention has been shown and described, many changes, modifications and substitutions may be made by one having ordinary skill in the art without necessarily departing from the spirit and scope of this invention.

We claim:

1. A converter adapted to be mounted within an opening in a wall wherein the wall at least partially defines a structure having an interior, said converter comprising:

a receptacle adapted to be received within the opening in the wall, said receptacle having a rear wall;

a cover plate;

means for attaching said cover plate to said receptacle to permit said cover plate to be opened to provide an opening in the receptacle through which access to the interior of said receptacle can be obtained, said cover plate being adapted to be exposed in the interior of the structure whereby access can be obtained to the interior of the receptacle from the interior of the structure;

vent opening means in said cover plate whereby ventilation air from the interior of the structure can pass through the receptacle;

a base mounting plate on said receptacle;

a plurality of circuit elements including a step-down transformer mounted on said base mounting plate, at least a major portion of said transformer being within the interior of said receptacle between said base mounting plate and said rear wall of said receptacle; and means for releasably mounting said base mounting plate on said receptacle whereby with said cover plate opened said base mounting plate can be removed from said receptacle through the opening in said receptacle to facilitate repair and testing of said plurality of circuit elements.

2. A converter as defined in claim 1 including a first mounting plate, means for releasably mounting the first mounting plate on the receptacle with at least a portion of said first mounting plate being spaced from said base mounting plate on the side thereof remote from said rear wall of said receptacle whereby air from said vent opening means can pass between said mounting plates, and at least one heat producing circuit element mounted on said first mounting plate.

3. A converter as defined in claim 2 wherein said plurality of circuit elements on said base mounting plate includes a first circuit element, a second of said first mounting plate being removed to provide access to said first circuit element from the interior of the structure when the cover plate is open.

4. A converter as defined in claim 1 wherein said cover plate includes an end wall and a peripheral wall, said peripheral wall includes at least one section which slopes inwardly as it extends toward said end wall, at least a portion of said vent opening means being in said one section of said peripheral wall.

5. A converter as defined in claim 4 wherein said one section includes a lower section, said vent means includes an opening in said lower section, and a grid having a plurality of apertures therein extending across said opening in said lower section, said grid comprising a plurality of grid elements at least some of which have non-circular, cross-sectional configurations, said grid elements being oriented to provide the maximum cross-sectional area for said apertures in the vertical direction when the converter is received in the opening in the wall.

6. A converter as defined in claim 1 including a dc circuit breaker enclosure, an ac circuit breaker enclosure, and a wiring enclosure, all of said enclosures being within said receptacle and located on one side of said base mounting plate, and a dc circuit breaker, an ac circuit breaker, and a plurality of conductors located, respectively, in said dc circuit breaker enclosure, said ac circuit breaker enclosure, and said wiring chamber enclosure.

7. A converter adapted to be mounted within an opening in a wall wherein the wall at least partially defines a structure having an interior, said converter comprising:

rectifier means for receiving and rectifying alternating current to provide fluctuating direct current;

filter means for filtering the fluctuating direct current to provide filtered direct current;

first means responsive to the filtered direct current to provide a high-frequency alternating current having a frequency much greater than the frequency of the alternating current received by said rectifier means;

transformer means for stepping down said high-frequency alternating current to a voltage level which is less than the voltage level of the alternating current received by said rectifier means;

means for converting the stepped down high-frequency alternating current to a direct current output;

a receptacle adapted to be received within the opening in the wall, said receptacle having a rear wall;

a cover plate;

means for attaching said cover plate to said receptacle to permit said cover plate to be opened to provide an opening in said receptacle through which access to the interior of the receptacle can be obtained, said cover plate being adapted to be exposed in the interior of the structure whereby access can be obtained to the interior of the receptacle from the interior of the structure;

vent opening means for permitting ventilation air to pass through the receptacle;

a base mounting plate on said receptacle;

each of said rectifier means, said filter means, said first means, said transformer means, and said converting means being a circuit element;

means for mounting said circuit elements within said receptacle with at least said filter means and said transformer means being between said base mounting plate and said rear wall of said receptacle and with at least one of said filter or transformer means being mounted on said base mounting plate; and means for releasably mounting said base mounting plate on said receptacle whereby with said cover plate opened the base mounting plate can be removed from said receptacle through the opening in said receptacle.

8. A converter as defined in claim 7 wherein said filter means and said transformer means are mounted on said base mounting plate.

9. A converter as defined in claim 7 including a first mounting plate, means for releasably mounting the first mounting plate on the receptacle with at least a portion of said first mounting plate being spaced from said base mounting plate on the side thereof remote from said rear wall of said receptable whereby air from said vent opening means can pass between said mounting plates, and at least one of said rectifier means and said converting means being mounted on said first mounting plate.

10. A converter as defined in claim 7 wherein said filter means is mounted on said base mounting plate and includes heat insulation means interposed between said base mounting plate and said filter means.

11. A converter as defined in claim 7 wherein said first means provides said high-frequency alternating current with a frequency of at least about 25,000 Hertz.

12. A converter as defined in claims 1 or 7 wherein said attaching means removably attaches said cover plate to said receptacle to permit said cover plate to be removed to provide access to the interior of said receptacle.

* * * * *